United States Patent
Kuchi

(10) Patent No.: US 10,411,770 B2
(45) Date of Patent: Sep. 10, 2019

(54) MULTIPLE INPUT MULTIPLE OUTPUT (MIMO) COMMUNICATION SYSTEM WITH TRANSMIT DIVERSITY

(71) Applicant: WISIG NETWORKS PRIVATE LIMITED

(72) Inventor: Kiran Kuchi, Hyperabad (IN)

(73) Assignee: Wisig Networks (IN)

( * ) Notice: Subject to any disclaimer, the term of this patent is extended or adjusted under 35 U.S.C. 154(b) by 0 days.

(21) Appl. No.: 15/981,782

(22) Filed: May 16, 2018

(65) Prior Publication Data

US 2018/0337714 A1    Nov. 22, 2018

(30) Foreign Application Priority Data

May 22, 2017    (IN) .............................. 201741017900

(51) Int. Cl.

| | |
|---|---|
| *H04B 7/0456* | (2017.01) |
| *H04W 72/04* | (2009.01) |
| *H04L 27/26* | (2006.01) |
| *H04B 7/12* | (2006.01) |
| *H04L 5/00* | (2006.01) |
| *H04L 25/03* | (2006.01) |
| *H03M 13/00* | (2006.01) |
| *H04L 25/02* | (2006.01) |

(52) U.S. Cl.
CPC ............. *H04B 7/0456* (2013.01); *H04B 7/12* (2013.01); *H04L 5/0023* (2013.01); *H04L 25/03159* (2013.01); *H04L 27/2636* (2013.01); *H04W 72/042* (2013.01); *H04W 72/0413* (2013.01); *H03M 13/611* (2013.01); *H04L 5/001* (2013.01); *H04L 5/0044* (2013.01); *H04L 5/0048* (2013.01); *H04L 5/0053* (2013.01); *H04L 5/0091* (2013.01); *H04L 25/0224* (2013.01)

(58) Field of Classification Search
USPC .......................................... 370/329, 491, 210
See application file for complete search history.

(56) References Cited

U.S. PATENT DOCUMENTS

2006/0268676 A1* 11/2006 Gore ......................... H04B 1/69
                                                                370/210
2007/0189334 A1*  8/2007 Awad .................. H04L 27/2621
                                                                370/491

(Continued)

*Primary Examiner* — Eva Y Puente
(74) *Attorney, Agent, or Firm* — Tran & Associates

(57) ABSTRACT

Embodiments of the present disclosure are related to transmitter and method of transmitting a signal stream from a plurality of antennas, in a communication network. The method comprises grouping, by a transmitter, a plurality of consecutive signals of the input to obtain a plurality of groups. Also, the method comprises generating a plurality of physical resource groups (PRGs) using the plurality of groups and a corresponding plurality of subcarriers and precoding each of the PRGs using one or more weighing coefficients to obtain precoded plurality of groups. Further, the method comprises processing the precoded plurality of groups to obtain a processed plurality of groups and transmitting the plurality of processed signal groups using a corresponding plurality of antennas. An indication about variation of the weighing coefficients corresponding to each of plurality of PRGs is provided by the transmitter to the one or more receivers.

18 Claims, 10 Drawing Sheets

(56) References Cited

U.S. PATENT DOCUMENTS

| | | | |
|---|---|---|---|
| 2013/0272254 A1* | 10/2013 | Goto | H04L 25/03159 370/329 |
| 2015/0023266 A1* | 1/2015 | Imamura | H04W 72/042 370/329 |
| 2015/0139112 A1* | 5/2015 | Park | H04B 7/0413 370/329 |
| 2016/0065340 A1* | 3/2016 | Li | H04B 7/0456 370/329 |
| 2018/0205523 A1* | 7/2018 | Imamura | H04W 28/06 |
| 2018/0227101 A1* | 8/2018 | Park | H04W 52/18 |
| 2018/0324020 A1* | 11/2018 | Hasegawa | H04L 27/2623 |

* cited by examiner

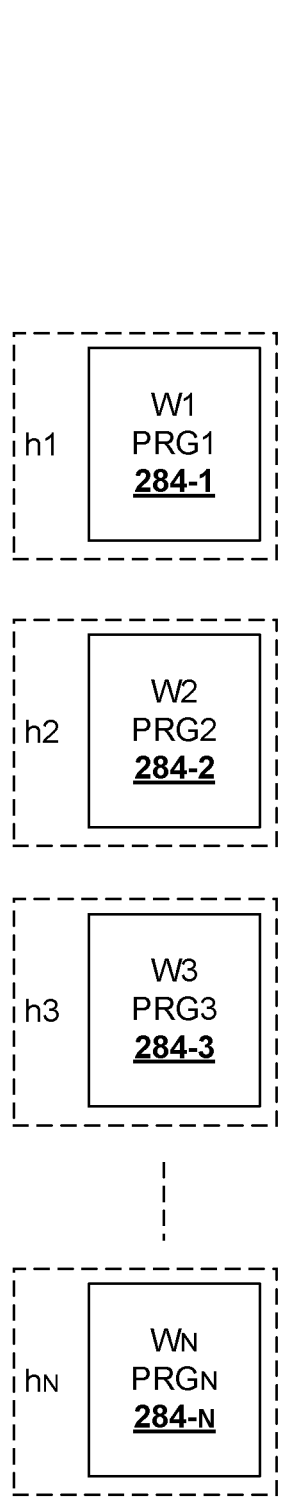
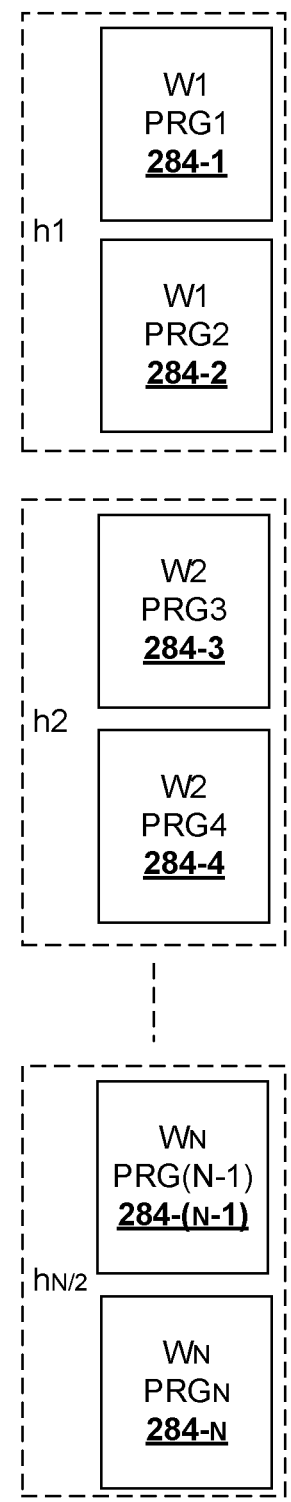
Fig. 6B
Fig. 6C

MULTIPLE INPUT MULTIPLE OUTPUT (MIMO) COMMUNICATION SYSTEM WITH TRANSMIT DIVERSITY

TECHNICAL FIELD

Embodiments of the present disclosure are related, in general to communication, but exclusively relate to transmit diversity in a multiple input multiple output (MIMO) transmitter.

BACKGROUND 5G new radio (NR) is in the process of being developed using 3GPP standard. An uplink (UL) of NR supports variable bandwidth and carrier frequency bands below 6 GHz and as well as above 6 GHz, including millimeter wave bands (e.g. 20-40 GHz and 60-80 GHz). The UL of NR supports cyclic prefix orthogonal frequency-division multiplexing (CP-OFDM) and discrete Fourier transform-spread-OFDM (DFT-S-OFDM), also referred as single-carrier frequency-division multiple access (SC-FDMA). For UL, the user equipment (UE), configured with multiple transmit antennas, involves a transmit diversity in certain channel conditions.

Generally, uplink or downlink transmit diversity (ULTD/DLTD) methods includes more than one transmit antennas at the UE or BS (base station), to improve the uplink or downlink transmission performance, i.e. reduce the transmit power, increase the coverage range, increase the data rate, or the combination of the above. The uplink transmission performance can also help improve the overall system capacity. Based on the feedback requirements, ULTD/DLTD schemes can be categorized into closed-loop (CL) and open-loop (OL) schemes.

The CL transmit diversity methods require a receiver to provide explicit feedback information about the spatial channel to assist the transmitter in choosing a transmission format over multiple transmit antennas. The OL transmit diversity methods do not have the requirement of feedback from the receiver.

For systems with transmit diversity, the received signal is a superposition of the different transmitted signals from all transmit antennas and consequently, the channel estimation becomes more complicated. In systems that employ open-loop precoding, the precoder (or the set of antenna weights) changes in at least one of time or frequency domain OFDM symbols. In such cases, the effective channel observed by the receiver undergoes variations as the precoder takes different values. There is a need for the receiver to adjust the channel estimation procedure based on precoder changes.

SUMMARY

The shortcomings of the prior art are overcome and additional advantages are provided through the provision of method of the present disclosure.

Additional features and advantages are realized through the techniques of the present disclosure. Other embodiments and aspects of the disclosure are described in detail herein and are considered a part of the claimed disclosure.

In an aspect of the present disclosure, a method of transmitting a signal stream from a plurality of antennas is provided. The method comprises grouping, by a transmitter, a plurality of consecutive signals of the input to obtain a plurality of groups. Also, the method comprises generating a plurality of physical resource groups (PRGs) using the plurality of groups and a corresponding plurality of subcarriers and precoding each of the PRGs using one or more weighing coefficients to obtain precoded plurality of groups. Further, the method comprises processing the precoded plurality of groups to obtain a processed plurality of groups and transmitting the plurality of processed signal groups using a corresponding plurality of antennas. An indication about variation of the weighing coefficients corresponding to each of plurality of PRGs is provided by the transmitter to the one or more receivers. Each of the plurality of PRGs is precoded with same weighing coefficient to obtain the precoded plurality of groups. In another embodiment, each of the plurality of PRGs is precoded with different weighing coefficient to obtain the precoded plurality of groups. Processing the plurality of precoded transformed groups comprises performing an Inverse Fast Fourier Transform (IFFT) operation on the precoded plurality of groups to produce a time domain signal groups and performing at least one of cyclic prefix (CP), windowing, and frequency shifting on the time domain signal groups, to generate a plurality of processed signal groups.

Another aspect of the present disclosure is a transmitter to transmit data in a communication network. The transmitter comprises a processor and a memory, communicatively coupled to the processor, wherein the memory stores processor-executable instructions, which, on execution, causes the processor to group a plurality of consecutive signals of the input to obtain a plurality of groups and generate a plurality of physical resource groups (PRGs) using the plurality of groups and a corresponding plurality of subcarriers. Also, the processor pre-codes each of the PRGs using one or more weighing coefficients to obtain precoded plurality of groups. Further, the processor processes the precoded plurality of groups to obtain a processed plurality of groups and transmits the plurality of processed signal groups using the corresponding plurality of antennas. An indication about variation of the weighing coefficients corresponding to each of plurality of PRGs is provided by the transmitter to the one or more receivers. Each of the plurality of PRGs is precoded with same weighing coefficient to obtain the precoded plurality of groups. In another embodiment, each of the plurality of PRGs is precoded with different weighing coefficient to obtain the precoded plurality of groups. Processing the plurality of precoded transformed groups comprises performing an Inverse Fast Fourier Transform (IFFT) operation on the precoded plurality of groups to produce a time domain signal groups and performing at least one of cyclic prefix (CP), windowing, and frequency shifting on the time domain signal groups, to generate a plurality of processed signal groups.

In an aspect of the present disclosure, a method of detecting a data stream in a communication network is provided. The method comprising estimating, by a receiver, one or more channel states based on an obtained granularity of precoder weights from a plurality of control signals received from a transmitter. Also, the method comprises equalizing a received data signal using the one or more estimated channel states to obtain an equalized signal and demodulating the equalized signal to generate an output signal.

Another aspect of the present disclosure is a receiver for receiving data in a communication network. The receiver comprising a processor and a memory, communicatively coupled to the processor, wherein the memory stores processor-executable instructions, which, on execution, causes the processor to estimate one or more channel states based on obtained granularity of precoder weights from a plurality of control signals received from a transmitter. Also, the processor equalizes a received data signal using the one or more estimated channel states to obtain an equalized signal and demodulate the equalized signal to generate an output signal.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE ACCOMPANYING DRAWINGS

The accompanying drawings, which are incorporated in and constitute a part of this disclosure, illustrate exemplary embodiments and, together with the description, serve to explain the disclosed principles. In the figures, the left-most digit(s) of a reference number identifies the figure in which the reference number first appears. The same numbers are used throughout the figures to reference like features and components. Some embodiments of device or system and/or methods in accordance with embodiments of the present subject matter are now described, by way of example only, and with reference to the accompanying figures, in which:

FIGS. 6B-6C illustrates granularity with which a channel estimator is working in a receiver, in accordance with an embodiment of the present disclosure.

DETAILED DESCRIPTION

Figure 1:
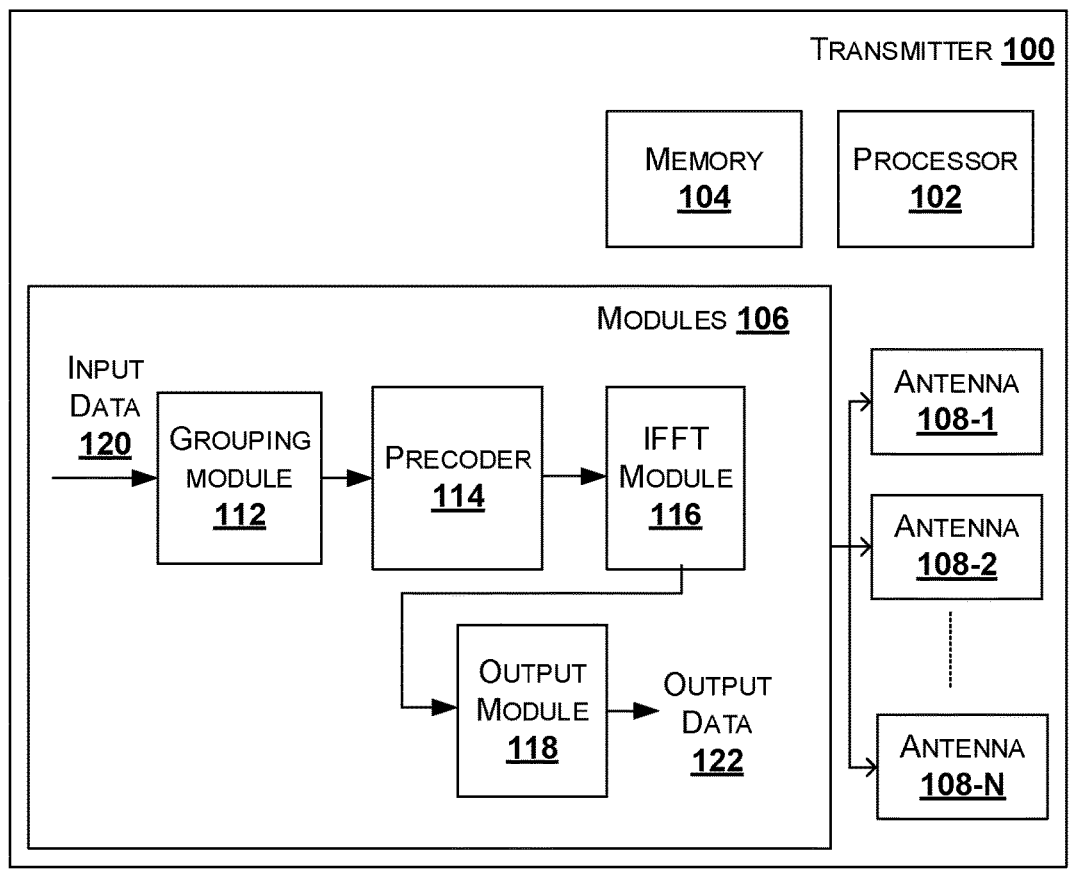
FIG. 1 shows an exemplary block diagram of a multiple input multiple output (MIMO) transmitter for transmitting an input stream, in accordance with an embodiment of the present disclosure.

In the present document, the word "exemplary" is used herein to mean "serving as an example, instance, or illustration." Any embodiment or implementation of the present subject matter described herein as "exemplary" is not necessarily to be construed as preferred or advantageous over other embodiments.

While the disclosure is susceptible to various modifications and alternative forms, specific embodiment thereof has been shown by way of example in the drawings and will be described in detail below. It should be understood, however that it is not intended to limit the disclosure to the particular forms disclosed, but on the contrary, the disclosure is to cover all modifications, equivalents, and alternative falling within the spirit and the scope of the disclosure.

The terms "comprises", "comprising", or any other variations thereof, are intended to cover a non-exclusive inclusion, such that a setup, device or method that comprises a list of components or steps does not include only those components or steps but may include other components or steps not expressly listed or inherent to such setup or device or method. In other words, one or more elements in a device or system or apparatus proceeded by "comprises . . . a" does not, without more constraints, preclude the existence of other elements or additional elements in the device or system or apparatus.

The terms "an embodiment", "embodiment", "embodiments", "the embodiment", "the embodiments", "one or more embodiments", "some embodiments", and "one embodiment" mean "one or more (but not all) embodiments of the invention(s)" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise. The terms "a", "an" and "the" mean "one or more", unless expressly specified otherwise.

Embodiments of the present disclosure relate to a communication system or a transmitter for transmitting an input signal stream using multiple antennas.

FIG. 1 shows an exemplary block diagram of a transmitter or a multiple input multiple output (MIMO) transmitter for transmitting an input stream, in accordance with an embodiment of the present disclosure.

As shown in FIG. 1, the transmitter or MIMO transmitter 100, also referred as transmitting system or communication system. The transmitter 100 includes a processor 102, memory 104, modules 106, and a plurality of antennas 108-1, 108-2, . . . , 108-N. The antennas 108-1, 108-2, . . . , 108-N are together referred with a reference numeral 108. The memory 104 may be communicatively coupled to the processor 102. The processor 102 may be configured to perform one or more functions of the transmitter 100 for transmitting input stream through plurality of MIMO antennas. In one implementation, the transmitter 100 may comprise modules 106 for performing various operations in accordance with the embodiments of the present disclosure.

The modules 106 includes a grouping module 112, a precoder 114, an inverse fast Fourier transform (IFFT) module 116, an output module 118.

The grouping module 112 is configured to receive input data 120, also referred as input stream or input signals or input data stream and group a plurality of consecutive signals of the input to obtain a plurality of groups. The input data 120 is at least one of data symbols, control information and reference symbols or pilot symbols. Also, the grouping module 112 is configured with a subcarrier module (not shown in the fig.) having a plurality of subcarriers. The plurality of groups of the input data 120 along with a corresponding plurality of subcarriers of predefined frequency, are grouped to form a plurality of physical resource groups (PRGs). The plurality of PRGs may be represented as PRG1, PRG2, . . . PRGn, where n is an integer. The input data 120 may be one of an Orthogonal Frequency Division Multiple Access (OFDMA) signal and a Discrete Fourier Transform spread OFDM (DFT-S-OFDMA) signal.

The precoder 114 is configured with one or more complex weights $W_1, W_2, \ldots, W_N$ for precoding the plurality of PRGs to obtain precoded plurality of groups. In an embodiment, each of the plurality of PRGs is precoded with a same weighing coefficient W1 to obtain the precoded plurality of groups. Also, each of the plurality of PRGs is precoded with different weighing coefficients to obtain the precoded plurality of groups.

The precoder 114 is configured with a complex weight module (not shown in Figs.), also referred as weight mapping module, weight module or complex weight mapping module. The complex weight module is configured with one or more complex weights to precode and generate precoded plurality of groups. The complex weight module may vary one of every OFDM symbol and a group of OFDM symbols, in an embodiment. Also, the precoder 114 is configured to provide an indication about variation of the weighing coefficients corresponding to each of PRG to at least one destination or receiver.

The precoder 114 performs the precoding on an input, which is the plurality of PRGs, to obtain precoded output which is precoded plurality of groups using one or more complex weights $W_1, W_2, \ldots, W_N$. Let the input be represented as symbols below:

$$x^0(0), x^0(1), x^0(2), \ldots, x^v(i)$$

and the precoder as precoder weight matrix: W(i)

For example, let the weighing coefficients be represented as one of $$\frac{1}{\sqrt{2}}\begin{bmatrix}1\\1\end{bmatrix} \text{ or } \frac{1}{\sqrt{2}}\begin{bmatrix}1\\-1\end{bmatrix} \text{ or } \frac{1}{\sqrt{2}}\begin{bmatrix}1\\j\end{bmatrix} \text{ or } \frac{1}{\sqrt{2}}\begin{bmatrix}1\\-j\end{bmatrix}$$

In another example, let the weighing coefficients be represented as matrix $$\frac{1}{\sqrt{2}}\begin{bmatrix}1 & 0 & j & 0\\0 & -1 & 0 & j\\0 & 1 & 0 & j\\1 & 0 & -j & 0\end{bmatrix}$$

The output of the precoder is $y(i)=W(i)\bar{x}(i)$. The precoder output in general is given by $$\begin{bmatrix}y^0(i)\\y^1(i)\\\vdots\\y^p(i)\end{bmatrix} = W(i)\begin{bmatrix}x^0(i)\\x^1(i)\\\vdots\\x^v(i)\end{bmatrix}$$

Figure 2A:
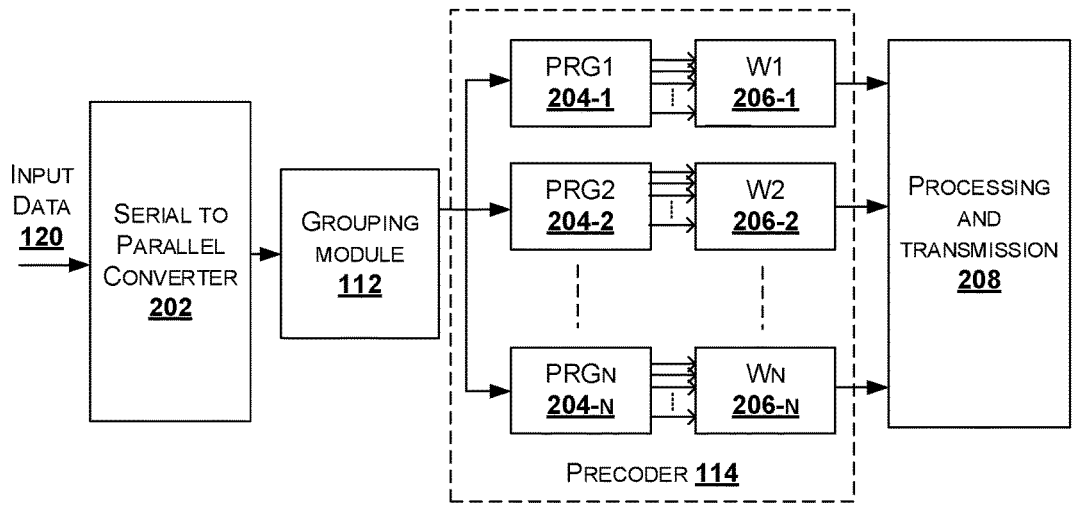
FIGS. 2A-2C shows illustration of the transmitter performing precoding, in accordance with an embodiment of the present disclosure.
Figure 2B:
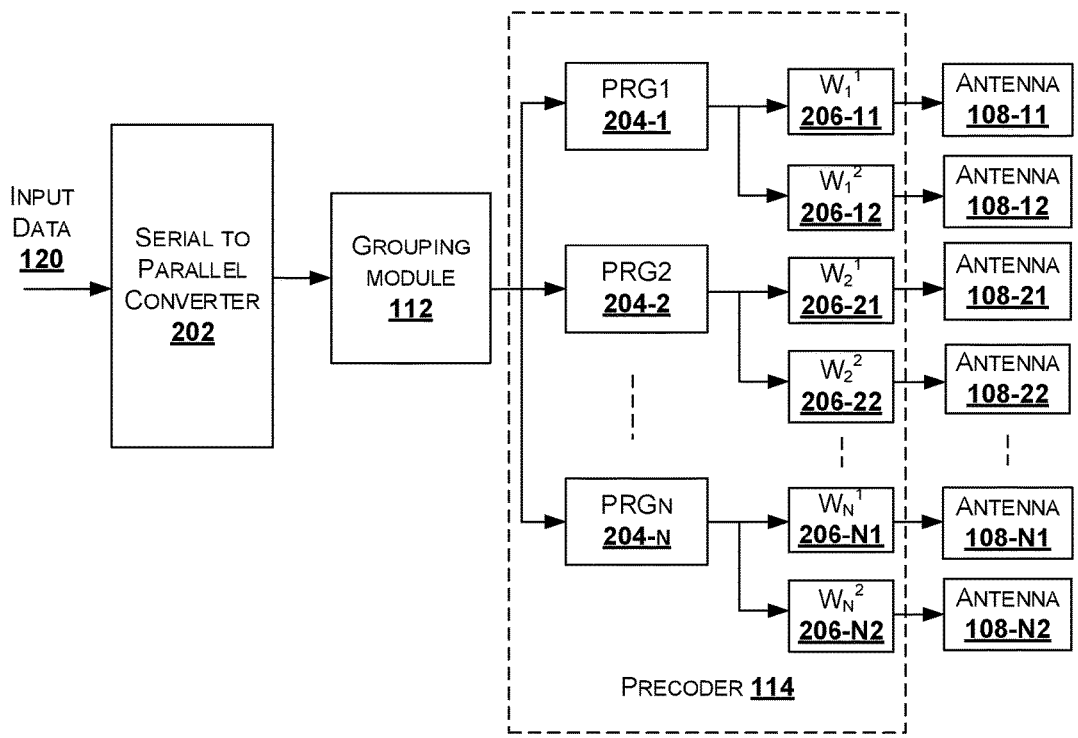
Figure 2C:
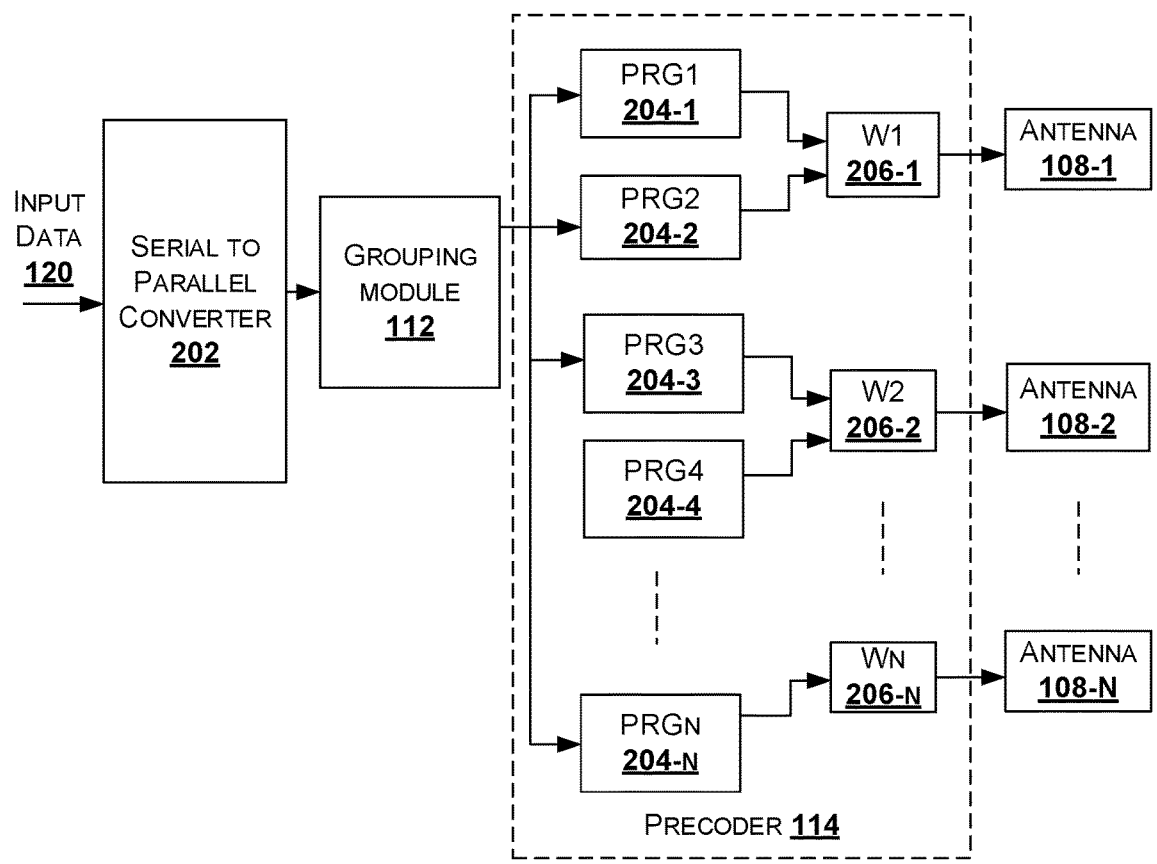

FIGS. 2A-2C shows illustration of the transmitter performing precoding, in accordance with an embodiment of the present disclosure.

Figure 2D:
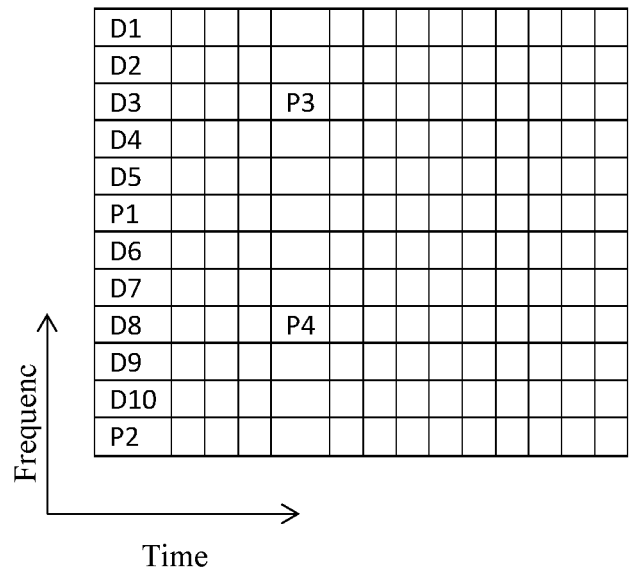
FIGS. 2D-2E illustrates an example of precoding in the MIMO transmitter, in accordance with an embodiment of the present disclosure.

As shown in the FIG. 2A, an input data 120 is converted from serial to parallel using a serial of parallel converter 202. The converted parallel symbols are grouped along with corresponding subcarriers using the grouping module 112 to obtain a plurality of PRGs, as shown in FIG. 2D. The precoder 114 is configured to perform precoding of each of the plurality of PRGs i.e. $PRG_1$ 204-1, $PRG_2$ 204-2, . . . , $PRG_N$ 204-N with different weighing coefficient $W_1$ 206-1 (as shown in FIG. 2E), $W_2$ 206-2, . . . , $W_N$ 206-N to obtain the precoded plurality of groups.

As shown in the FIG. 2B, the precoder 114 is configured to perform precoding for a plurality of PRGs, i.e. $PRG_1$ 204-1, $PRG_2$ 204-2, . . . , $PRG_N$ 204-N with corresponding weighing coefficients ($W_1^1$ 206-11, $W_1^2$ 206-12), ($W_2^1$ 206-21, $W_2^2$ 206-22), . . . ($W_N^1$ 206-N1, $W_N^2$ 206-N2) to obtain the precoded plurality of groups. The weights or weighing coefficients $W_1^1$ and $W_1^2$ are the subsets of the weight matrix $W_1$. Similarly, the weighing coefficients $W_2^1$ and $W_2^2$ are the subsets of the weight matrix $W_2$. The obtained precoded groups are transmitted using corresponding antennas i.e. antennas 108-11, 108-12 for precoded $PRG_1$ 204-1, antennas 108-21, 108-22 for precoded $PRG_2$ 204-2, and antennas 108-N1, 108-N2 for precoded $PRG_N$ 204-N.

As shown in the FIG. 2C, the precoder is configured to perform precoding for a plurality of PRGs, i.e. $PRG_1$ 204-1, $PRG_2$ 204-2, $PRG_3$ 204-3, $PRG_4$ 204-4, . . . , $PRG_N$ 204-N with weighing coefficient $W_1, W_2, W_3, \ldots, W_N$ to obtain the precoded plurality of groups. As shown in FIG. 2C, the precoded symbols of the plurality of groups is obtained using different weighing coefficients for different PRGs, and the precoded symbols corresponding to one or more PRGs are transmitted using corresponding antennas. For example, the $PRG_1$ 204-1, $PRG_2$ 204-2 are precoded using weighing coefficient $W_1$ to obtain a first precoded PRG group which is transmitted using an antenna 108-1. Similarly, $PRG_3$ 204-3, $PRG_4$ 204-4 are precoded using weighing coefficient $W_2$ to obtain a second precoded PRG group which is transmitted using an antenna 108-2.

Figure 2E:
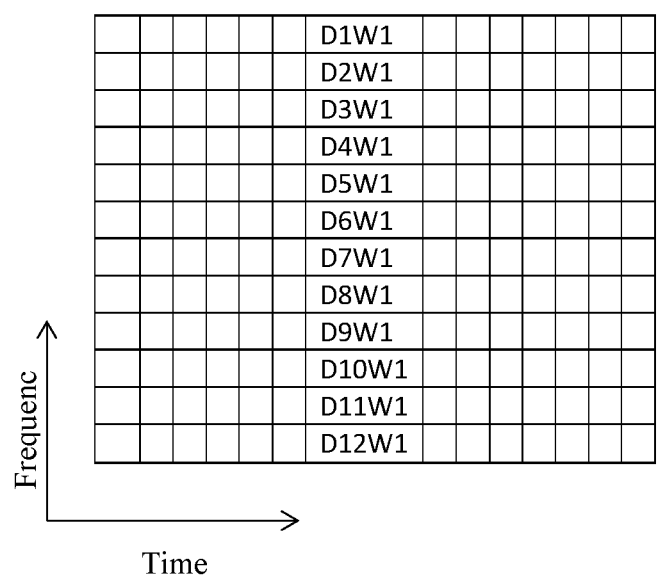

FIGS. 2D-2E illustrates an example a physical resource group structure, in accordance with an embodiment of the present disclosure. In an embodiment of uplink of LTE which uses DFT-S-FDMA, the basic PRG which is also called a tile, may be composed of P subcarrier and 7 OFDM symbols. The PRG is the basic physical unit for resource allocation that comprises P consecutive subcarriers by Q consecutive OFDMA symbols. A Typical value for P is 18 subcarriers and Q is 5 or 6 or 7 OFDMA symbols. A logical resource unit (LRU) is the basic logical unit for distributed and localized resource allocations. An LRU is PQ subcarriers. The LRU includes the pilot tones that are used in a PRG. The effective number of subcarriers in an LRU depends on the number of allocated pilots. A typical slot format for localized/distributed SC-FDMA, which is used in the 3GPP-LTE standard, is shown in FIG. 2D. The slots denoted by P are slots which contain allocated pilots.

A typical slot format for localized/distributed DFT-S-OFDMA comprises of 12*m subcarriers in frequency and 7-OFDM symbols, where "m" is a positive integer. Pilot tones are transmitted in the first and fifth OFDM symbol. The remaining 12 DFT-S-OFDM symbols are used for transmission of DFT-S-OFDMA data tones. In LTE, pilot symbols do not use DFT spreading. The pilot tones are directly modulated using constant-amplitude-zero-auto-correlation (CAZAC) sequences which have low peak-to-average-power-ratio (PAPR). In DFT-S-OFDMA, the number of allocated tones in a slot is generally an integer multiple of 12. Therefore, in LTE, the uplink slot comprises of P subcarriers in frequency and 7 OFDM symbols.

In multi-user systems, resources are allocated in time and frequency dimensions, where the basic signal is confined to one OFDM symbol that spans N subcarriers spanning entire bandwidth. A basic unit for transmission is a slot which is composed of P subcarriers and Q OFDM symbols. Data is allocated in terms of slots which are either contiguous (localized) or scattered (distributed) in a two-dimensional time-frequency grid that contains N subcarriers and M OFDM symbols where (N>>P and M>>Q). P and Q may be greater than one. Each slot is designated by the two dimensional index (p,q) where p is the frequency index and q is the time index and p=1, 2, ..., Nf, q=1, 2, ... Nt. Nt is equal to the total number slots in time axis. Nf is equal to the total number slots in frequency axis. Nt+Nf is equal to the total number of allocated slots. For example, slot (1,1) and (1,2) are two adjacent slots in time and slot (1,1) and (2,1) are two adjacent slots in frequency. The size of the basic resource unit in the uplink can be same or different from that of the downlink i.e., the pair P and Q in the uplink can be same or different from that of the downlink.

For example, minimum number of resource elements Pmin and Qmin for CP-OFDM and DFT-S-OFDM respectively, for 2-symbol short PUCCH is Qmin=1, i.e. the precoder may change in time after first OFDM symbol and no change in the precoder in frequency.

Pmin=12, i.e. the precoder may change after every 12 tones in frequency and may not change in precoder over a 2-symbol span of PUCCH. The precoder may change after every 12 tones and after first OFDM symbol, in an embodiment.

In another example, following are the values for Pmin and Qmin for one of CP-OFDM and DFT-S-OFDM respectively, for 1-symbol PUCCH:

The precoder changes after every 12 tones, in frequency for CP-OFDM.

The precoder changes every tone in frequency for CP-OFDM or DFT-S-OFDM

In example embodiment, the following are the values for Pmin and Qmin for one of CP-OFDM and DFT-S-OFDM, for PUSCH or long duration PUCCH The precoder changes after every 7 OFDM symbols or 14 OFDM symbols in time for CP OFDM or DFT-S-OFDM.

The precoder changes after every 12 tones, in frequency for CP OFDM.

The precoder changes every subcarrier (phase rotation) for CP-OFDM and DFT-S-OFDM Referring back to FIG. 1, the inverse fast Fourier transform (IFFT) module 116, also referred as inverse discrete Fourier transform (IDFT) module, performs inverse transform operation on the precoded plurality of PRGs to generate a time domain signals. The IFFT module 116 performs the first step of processing the output of precoder 114. The output module 118 performs second stage of processing on the precoded plurality of PRGs. The second stage of processing comprises at least one of addition of cyclic prefix, cyclic suffix, windowing, windowing with overlap and adding operation (WOLA) and filtering of the time domain signal to generate an output sequence. The output sequence is fed to corresponding antennas 108-1, 108-2, ..., 108-N, for transmission. In an embodiment, the output sequence is converted in to an analog waveform using digital to analog converter (DAC) to generate analog output waveform. The corresponding plurality of antennas 108-1, 108-2, ..., 108-N transmits the output sequence to one or more receiver, or a destination. A frequency shift may be added to the output data 122 or converted analog signal before transmission by the transmitter 100. The output module 118 indicates variation of the weighing coefficients corresponding to each of plurality of PRGs to the one or more receivers. After the indication, the output sequence is transmitted to one or more receivers.

The transmitter 100 informs the destination i.e. receiver or user equipment or any other communication system, indicating about the precoding using the control information, in an embodiment. The transmitter 100 conveys the precoding information using one of downlink control information (DCI) or UCI (Uplink Control Information), to a destination.

In an embodiment, the transmitter 100 for NR, transmits at least one of short physical uplink control channel (PUCCH) over one OFDM symbol, long PUCCH over one or more RBs and physical uplink shared channel (PUSCH) transmitted over one or more RBs.

In one embodiment, the transmitter 100 for LTE uses a single slot, which comprises twelve subcarriers and seven OFDM symbols. For data channels, one out of seven OFDM symbols is reserved for reference symbols/pilots that are used for channel estimation. For control channels, one RB uses multiple OFDM symbols for reference symbols (RS). The pilots may be at least one of Zadoff-Chu (ZC) sequences and BPSK modulated sequences.

In an embodiment, each PRG includes pilots/RS that are used for channel estimation, and size of each PRG is variable. The PRG includes a single OFDM or two OFDM symbols or seven OFDM symbol and the like. For example, when the PRG has a short duration, channel estimation may utilize the pilots/RSs that are present in multiple OFDM symbols over multiple subcarriers for improving channel estimation quality. However, if the complex weights vary in one of frequency and time, the channel estimation is performed by restricting the estimation to the pilots/RS over which the complex weights are kept constant.

In an embodiment, the standard/specification associated with the communication system 100, 200 specifies at least one of pattern, weights and the precoder or complex weights. Then, a base station may optimize the channel estimation over the time/frequency over which the precoder/complex weight module 118 is constant. The standard/specification associated with the communication systems 100, 200 may not specify the weights/precoder, in an embodiment. The user or an UE may apply a precoder randomly, and the precoder is implementation specific. However, the BS requires certain information from the UE or the standard for optimizing the channel estimation. The communication system 100, 200 may be configured with a standard, which specifies that the precoder/complex weight module 118 may vary only after at least one of Qmin OFDM symbols and Pmin subcarriers. The UE may select a precoder according the received criterion from the communication system 100, 200 and thus the BS optimizes the channel estimation.

In an embodiment, the UE or communication system 100, 200 performs signaling to the BS an indication, which determines the precoder type. The exact precoder pattern may be implementation specific, which has minimum duration over which the precoder is constant and is indicated as a precoder type. The indicator singling may be different or same for PUSCH, short/long PUCCH. The signaling is performed through one of a control channel and an RRC message. Also, the indicator may indicate that the precoder or complex weights is fixed over a duration of one of coding block, a long block, that is no channel variations are induced through precoding over the given complex weights. The UE/user may change the precoder/complex weights from one coding block to another coding block.

In another embodiment, the communication system 100, 200 performs signaling as a specific precoder type or pattern. The exact precoder pattern signaled is for a minimum duration over which, the precoder/complex weights are constant and is specified as a precoder type. The precoder type may be different or same for PUSCH, short/long PUCCH. The indicator indicates the precoder is fixed over the duration of the coding block (long block), that is there is no channel variations through precoding over the given coding block. In an embodiment, the UE/user may change the precoder from one coding block (long block) to another.

The indicator types may be one of indicator type-1, indicator type-2 and indicator type-3. For the indicator type-1, the precoder/complex weight is constant for Qmin OFDM symbols and may change after Qmin OFDM symbols. The data/control may be coded over multiple blocks comprising of Qmin OFDM symbols. If Qmin is a long block such that data/control is coded within Qmin OFDM symbols, then the precoder does not provide transmit diversity gain in one coding block but the precoder still vary from one coding block to other.

For the indicator type-2, the precoder is constant for Pmin subcarriers and may change after Pmin subcarriers. The data/control may be coded over multiple blocks comprising of Pmin subcarriers, where transmit diversity gain may be obtained. If Pmin is chosen as a long block such that data/control is coded within Pmin subcarriers, then the precoder does not provide transmit diversity gain in one coding block but the precoder still vary from one coding block to other. The indicator type-3 may be at least one of Pmin and Qmin such that channel estimation quality may be obtained.

In an embodiment, the indicator type may be signalled by BS/communication system 100, 200 to a UE or receiver, in one of UE manner, group UE specific manner, use the same type for all UEs. The indicator type may vary with one of UE or channel conditions. The BS may optimize the indicator type as a trade-off between channel estimation quality and diversity gain.

In another embodiment, the indicator type may be signalled by a transmitter i.e. UE 100 to a BS or a receiver. The indicator type may vary with the UE or in time based on channel conditions. The BS or receiver may optimize the indicator type as a trade-off between channel estimation quality and diversity gain.

Figure 3:
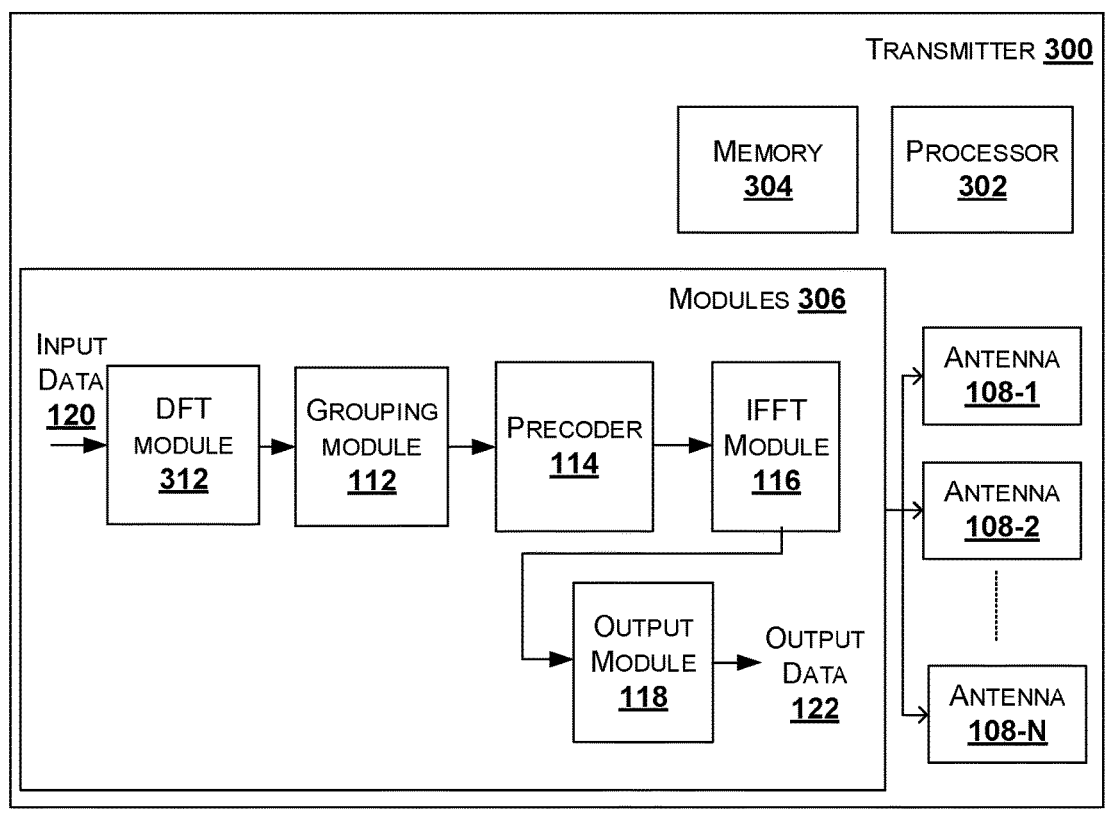
FIG. 3 shows an exemplary block diagram of a multiple input multiple output (MIMO) transmitter for transmitting an input stream, in accordance with some embodiments of the present disclosure.

FIG. 3 shows a block diagram of a multiple input multiple output (MIMO) transmitter for transmitting an input stream, in accordance with another embodiment of the present disclosure.

As shown in FIG. 3, the MIMO transmitter 300, also referred as transmitting system or communication system. The transmitter 300 includes a processor 302, memory 304, modules 306, and a plurality of antennas 108-1, 108-2, . . . , 108-N. The antennas 108-1, 108-2, . . . , 108-N are together referred with a reference numeral 108. The memory 304 may be communicatively coupled to the processor 302. The processor 302 may be configured to perform one or more functions of the transmitter 300 for transmitting input stream through plurality of MIMO antennas. In one implementation, the transmitter 300 may comprise modules 306 for performing various operations in accordance with the embodiments of the present disclosure.

The modules 306 includes a discrete Fourier transform (DFT) module 312, grouping module 112, a precoder 114, an inverse fast Fourier transform (IFFT) module 116, an output module 118.

The DFT module 312 performs discrete Fourier Transform on an input stream, which is at least one of data, control signal and reference symbol (RS), to generate transformed sequence. In an embodiment, the input data is a Discrete Fourier Transform spread OFDM (DFT-S-OFDMA) signals or symbols. The DFT module 312 may be configured with fast Fourier transform (FFT), in an embodiment. The grouping module 112 is configured to receive input data 120 and group a plurality of consecutive signals of the input to obtain a plurality of groups. Also, the grouping module 112 is configured with a subcarrier module (not shown in the fig.) having a plurality of subcarriers. The plurality of groups of the input data 120 along with a corresponding plurality of subcarriers of predefined frequency, are grouped to form a plurality of physical resource groups (PRGs). The plurality of PRGs may be represented as PRG1, PRG2, PRGn, where n is an integer.

The precoder 114 is configured with one or more complex weights $W_1, W_2, \ldots, W_N$ for precoding the plurality of PRGs to obtain precoded plurality of groups.

The inverse fast Fourier transform (IFFT) module 116, also referred as inverse discrete Fourier transform (IDFT) module, performs inverse transform operation on the precoded plurality of PRGs to generate a time domain signals. The IFFT module 116 performs the first step of processing the output of precoder 114. The output module 118 performs second stage of processing on the precoded plurality of PRGs. The second stage of processing comprises at least one of addition of cyclic prefix, cyclic suffix, windowing, windowing with overlap and adding operation (WOLA) and filtering of the time domain signal to generate an output sequence. The output sequence is fed to corresponding antennas 108-1, 108-2, . . . , 108-N, for transmission. In an embodiment, the output sequence is converted in to an analog waveform using digital to analog converter (DAC) to generate analog output waveform. The corresponding plurality of antennas 108-1, 108-2, . . . , 108-N transmits the output sequence to a destination. A frequency shift may be added to the output data 122 or converted analog signal before transmission by the transmitter 100. The output module 118 indicates variation of the weighing coefficients corresponding to each of plurality of PRGs to the one or more receivers. After the indication, the output sequence is transmitted to one or more receivers.

The transmitter 100 informs the destination i.e. receiver or user equipment or any other communication system, about the precoding implicitly using the control information, in an embodiment. The transmitter 100 conveys the information in one of downlink control information (DCI) and UCI (Uplink Control Information), to a destination.

Figure 4:
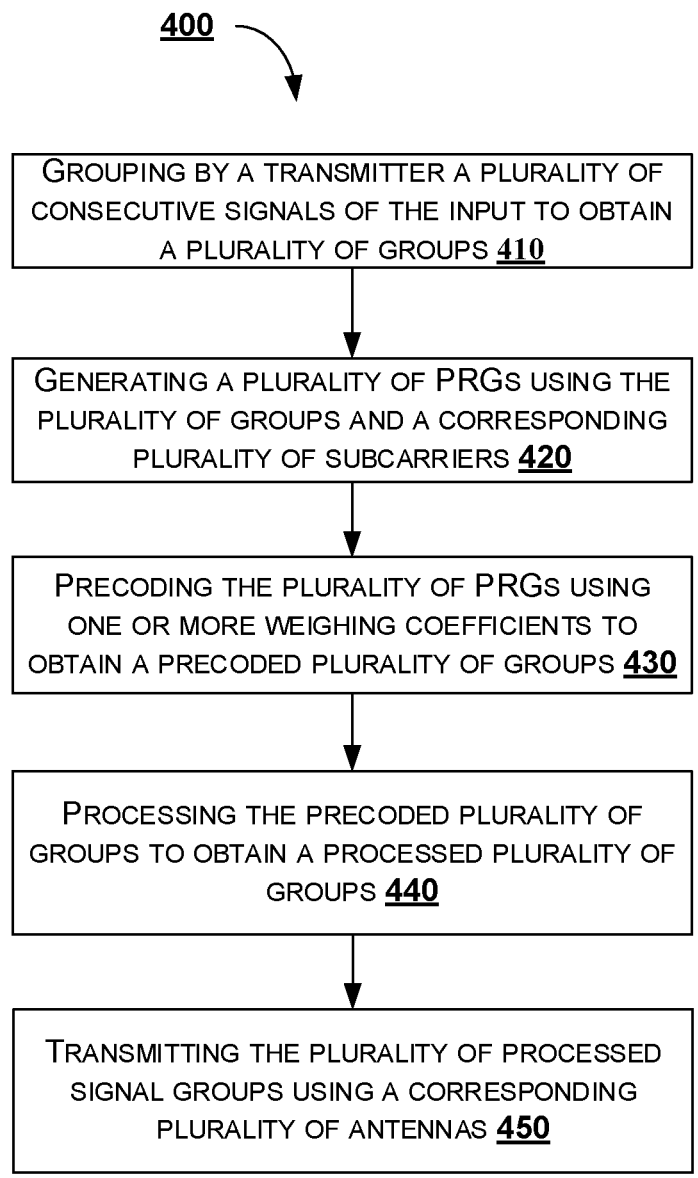
FIG. 4 shows a flowchart illustrating a method of transmitting a signal stream from a plurality of antennas, in accordance with some embodiments of the present disclosure.

FIG. 4 shows a flowchart illustrating a method of transmitting a signal stream from a plurality of antennas, in accordance with some embodiments of the present disclosure.

As illustrated in FIG. 4, the method 400 comprises one or more blocks for transmitting a signal stream from a plurality of antennas. The order in which the method 400 is described is not intended to be construed as a limitation, and any number of the described method blocks can be combined in any order to implement the method. Additionally, individual blocks may be deleted from the methods without departing from the spirit and scope of the subject matter described herein. Furthermore, the method can be implemented in any suitable hardware, software, firmware, or combination thereof.

At block 410, grouping a plurality of consecutive signals of the input is performed by a grouping module 112, to obtain a plurality of groups. The input data is at least one of data symbols, control information and reference symbols or pilot symbols. Also, the input data 120 may be one of an Orthogonal Frequency Division Multiple Access (OFDMA) signal and a Discrete Fourier Transform spread OFDM (DFT-S-OFDMA) signal.

At block 420, generating a plurality of physical resource groups (PRGs) using the plurality of groups and a corresponding plurality of subcarriers. The plurality of groups of the input data 120 along with a corresponding plurality of subcarriers of predefined frequency, are grouped by the grouping module 112 to form a plurality of physical resource groups (PRGs). The plurality of PRGs may be represented as PRG1, PRG2, . . . PRGn, where n is an integer.

At block 430, precoding the plurality of PRGs is performed by the precoder 114, using one or more weighing coefficients to obtain a precoded plurality of groups. The precoder 114 is configured with one or more complex weights $W_1, W_2, \ldots, W_N$, using which the precoding of the plurality of PRGs is performed. In an embodiment, each of the plurality of PRGs is precoded with a same weighing coefficient W1 to obtain the precoded plurality of groups. Also, each of the plurality of PRGs is precoded with different weighing coefficients to obtain the precoded plurality of groups.

At block 440, processing the precoded plurality of groups, is performed by the IFFT module 116 and output module 118, to obtain a processed plurality of groups. The IFFT module 116 performs an inverse transform operation on the precoded plurality of PRGs to generate a time domain signals. The IFFT module 116 performs the first step of processing the output of precoder 114. The output module 118 performs second stage of processing on the precoded plurality of PRGs. The second stage of processing comprises at least one of addition of cyclic prefix, cyclic suffix, windowing, windowing with overlap and adding operation (WOLA) and filtering of the time domain signal to generate an output sequence.

At block 450, transmitting the plurality of processed signal groups i.e. output sequence from block 440 using a corresponding plurality of antennas to one or more receivers. The output sequence may be converted in to an analog waveform using digital to analog converter (DAC) to generate analog output waveform, in an embodiment. The corresponding plurality of antennas 108-1, 108-2, . . . , 108-N transmits the output sequence to a destination. A frequency shift may be added to the output data 122 or converted analog signal before transmission by the transmitter 100.

Further, a provision for the indication about variation of the precoder weighing coefficients corresponding to each of the plurality of PRGs, is provided by the transmitter to the receiver. The transmitter 100 informs the destination i.e. receiver or user equipment or any other communication system, indicating about the precoding using the control information, in an embodiment. The transmitter 100 conveys the precoding information using one of downlink control information (DCI) or UCI (Uplink Control Information), to a destination.

Figure 5A:
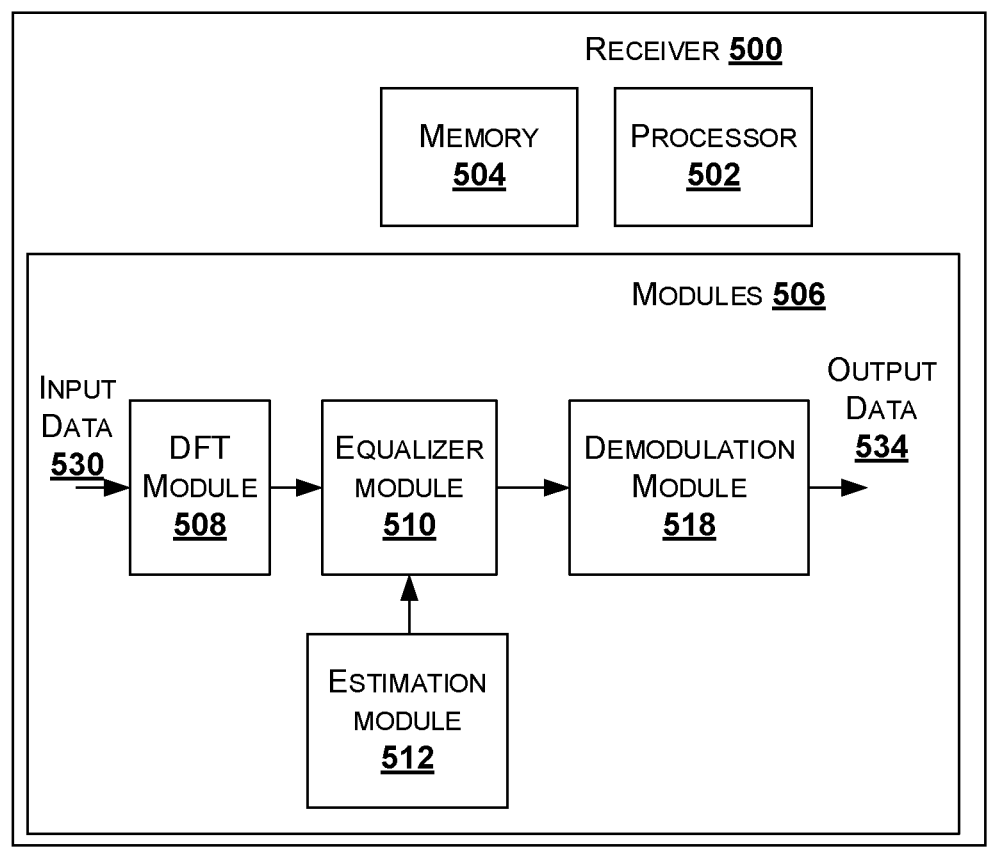
FIG. 5A shows a block diagram of a receiver for receiving a precoded waveform from a MIMO transmitter, in accordance with an embodiment of the present disclosure.

FIG. 5A shows a block diagram of a receiver for receiving a precoded waveform from a MIMO transmitter, in accordance with an embodiment of the present disclosure.

As shown in FIG. 5A, the receiver 500, also referred as a communication system or receiver system, includes the processor 502, and the memory 504. The memory 504 may be communicatively coupled to the processor 502. The processor 502 may be configured to perform one or more functions of the receiver 500 for receiving data. In one implementation, the receiver 500 may comprise modules 506 for performing various operations in accordance with the embodiments of the present disclosure.

The modules 506 includes a discrete Fourier Transform (DFT) module 508, an equalizer module 510, an estimation module 512, and a demodulation module 516. The estimation module 512 is also referred as channel estimator or channel estimation module. The receiver 500 receives the communication data or an input data 530 using plurality of antennas (not shown in FIG. 5A) from at least one transmitter. In the baseband portion, the receiver includes the modules such as, but not limited to, carrier down conversion, analog to digital conversion which not shown.

The DFT module 508 transforms the input data 530 from the time domain in to frequency domain, to generate frequency domain data. The equalizer module 510 performs equalization of transformed data using the channel estimation data to generate equalized data. Also, the equalizer module 510 receives the channel estimation data as input from the estimation module 512, which is also referred as a channel estimation module. The estimation module 512 performs estimation of channel through which the receiver 500 receives the input data 530. After performing the channel estimation, the equalizer module 510 performs equalization of transformed data using the channel estimated data. After equalization, using one of the downlink control information (DCI) or uplink control information (UCI), the time domain data is de-modulated to obtain the actual data.

Figure 5B:
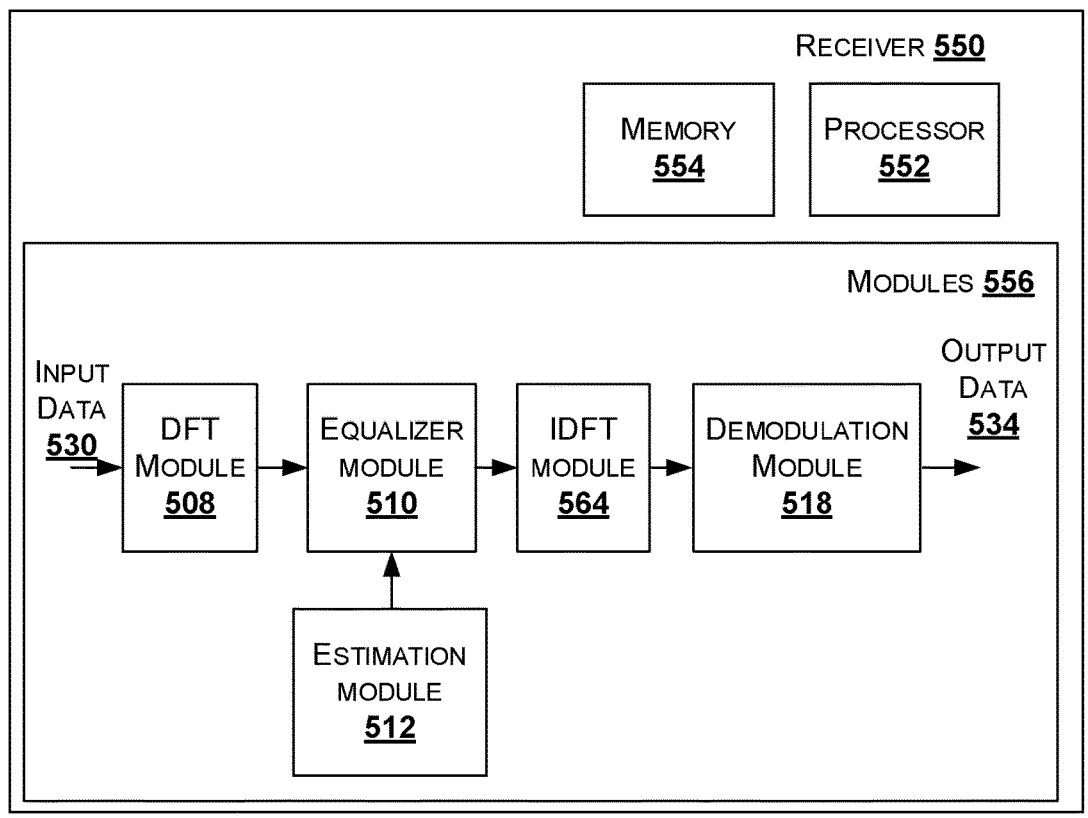
FIG. 5B shows a block diagram of a receiver for receiving a precoded waveform from a MIMO transmitter, in accordance with another embodiment of the present disclosure.

FIG. 5B shows a block diagram of a receiver for receiving a precoded waveform from a MIMO transmitter, in accordance with another embodiment of the present disclosure.

As shown in FIG. 5B, the receiver 550, also referred as a communication system or receiver system, includes the processor 552, and the memory 554. The memory 554 may be communicatively coupled to the processor 552. The processor 552 may be configured to perform one or more functions of the receiver 550 for receiving data. In one implementation, the receiver 550 may comprise modules 556 for performing various operations in accordance with the embodiments of the present disclosure.

The modules 556 includes a discrete Fourier Transform (DFT) module 508, an equalizer module 510, an estimation module 512, an inverse DFT (IDFT) module 564, and a demodulation module 516. The estimation module 512 is also referred as channel estimator or channel estimation module. The receiver 550 receives the communication data or an input data 530 using plurality of antennas (not shown in FIG. 5B) from at least one transmitter. In the baseband portion, the receiver includes the modules such as, but not limited to, carrier down conversion, analog to digital conversion which not shown.

The DFT module 508 transforms the input data 530 from the time domain in to frequency domain, to generate frequency domain data. The equalizer module 510 performs equalization of transformed data using the channel estimation data to generate equalized data. Also, the equalizer module 510 receives the channel estimation data as input from the estimation module 512, which is also referred as a channel estimation module. The estimation module 512 performs estimation of channel through which the receiver 500 receives the input data 530. After performing the channel estimation, the equalizer module 510 performs equalization of transformed data using the channel estimated data. After equalization, an inverse DFT is performed using IDFT module 564 on the equalized data, to generate time domain data. Thereafter, using one of the downlink control information (DCI) or uplink control information (UCI), the time domain data is de-modulated to obtain the actual data.

Figure 6A:
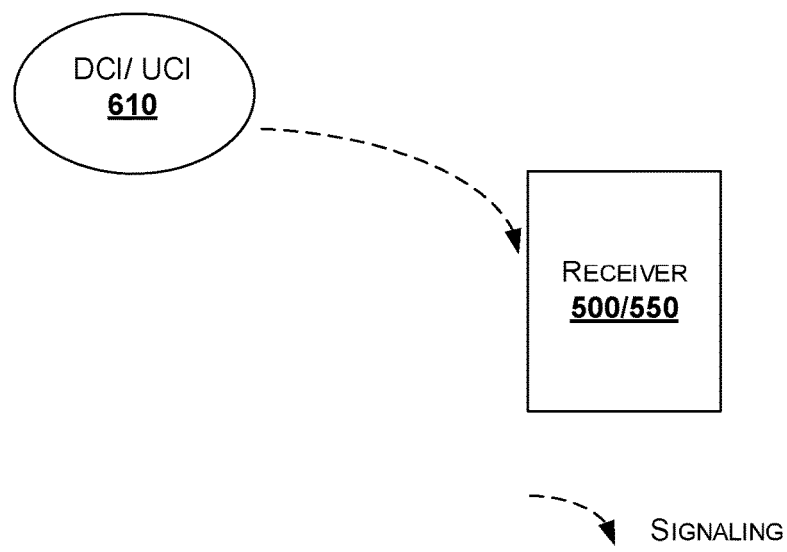
FIG. 6A illustrates a receiver receiving information from a transmitter through a channel, in accordance with another embodiment of the present disclosure.

FIG. 6A illustrates a receiver receiving information from a transmitter through a channel, in accordance with another embodiment of the present disclosure. As shown in FIG. 6A, the receiver 500, 550 receives channel information via the control information i.e. one of downlink control information (DCI) and Uplink Control Information (UCI), transmitted by a transmitter 100, 300. The control information indicates about variation of the weighing coefficients corresponding to each of PRG, transmitted by the transmitter. FIGS. 6B-6C illustrates granularity with which a channel estimator is working in a receiver, in accordance with an embodiment of the present disclosure. The channel is assumed to be same for all the PRGs, undergoing same precoder weights. The channel estimator is configured according to the FIGS. 6B-6C. The information about the variation of precoding weights is communicated either explicitly or implicitly which in turn helps in configuring the channel estimator module accordingly.

For example, let h1 denote the channel state of antenna-1 108-1 and h2 channel state of antenna-2 108-2. Considering, the complex weights $W_1=[1\ 0]$ and $W_2=[0\ 1]$, wherein $W_1$ and $W_2$ are applied over PRG or consecutive resource blocks (RBs) in time, then the equivalent channel is h1 over time span of PRG1 and h2 over time span of PRG2, as shown in FIG. 6B. In another example, let $W_1=[1\ 1]$ and $W_2=[1\ -1]$, then a base station (BS) receiver equivalent channel becomes h1+h2 and h1−h2 over adjacent PRGs in time. If the precoders vary in adjacent PRGs in frequency, then the BS identifies variation in channel states with respect to frequency. For example, the $PRG_1$ 204-1, $PRG_2$ 204-2 are precoded using weighing coefficient $W_1$ is transmitted through the channel h1, is received by the receiver 500, 550. Similarly, $PRG_3$ 204-3, $PRG_4$ 204-4 are precoded using weighing coefficient $W_2$ is transmitted through h2, is received by the receiver 500, 550, as shown in FIG. 6C. The channel is assumed to be same for all the plurality of the PRGs of undergoing same precoder weights, as configured in the channel estimation module 512. The information about the variation of precoding weights is communicated either explicitly or implicitly, by the transmitter, which in turn helps in configuring the channel estimation module 512 accordingly.

Figure 7:
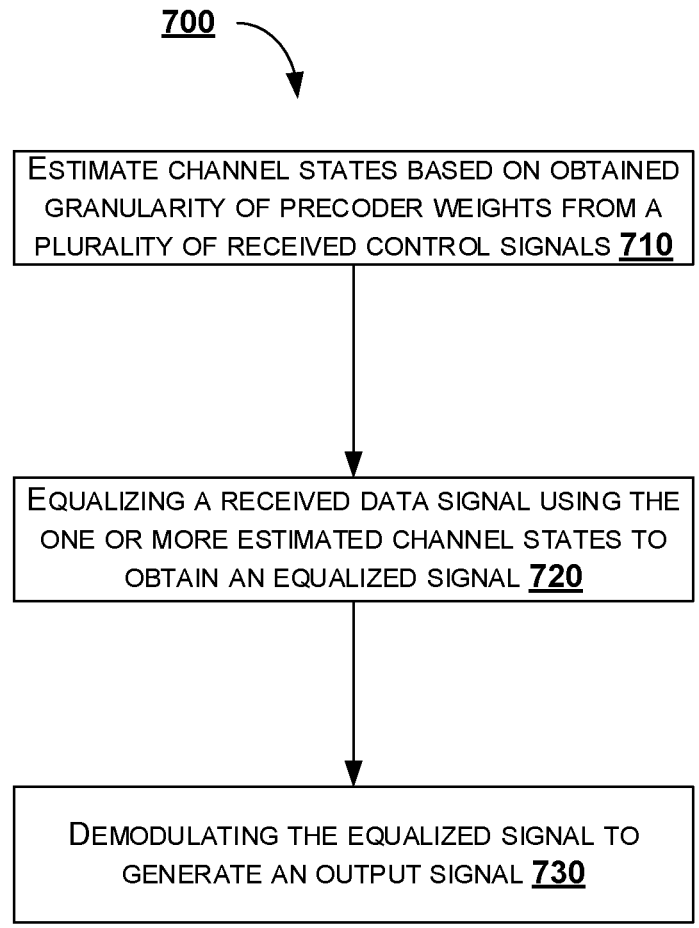
FIG. 7 shows a flowchart illustrating a method of detecting a data stream in a communication network, in accordance with some embodiments of the present disclosure.

FIG. 7 shows a flowchart illustrating a method of detecting a data stream in a communication network, in accordance with some embodiments of the present disclosure.

As illustrated in FIG. 7, the method 700 comprises one or more blocks for detecting a data stream in a communication network. The order in which the method 700 is described is not intended to be construed as a limitation, and any number of the described method blocks can be combined in any order to implement the method. Additionally, individual blocks may be deleted from the methods without departing from the spirit and scope of the subject matter described herein. Furthermore, the method can be implemented in any suitable hardware, software, firmware, or combination thereof.

At block 710, estimating, by a receiver, one or more channel states based on an obtained granularity of precoder weights from a plurality of control signals received from a transmitter. The control signals are one of downlink control information (DCI) and Uplink Control Information (UCI) associated with the transmitter.

At block 720, equalizing, by the receiver, a received data signal using the one or more estimated channel states to obtain an equalized signal. In an embodiment, the received data signal is transformed in to frequency domain, using discrete Fourier Transform (DFT) module 508. The transformed data is equalized by the equalizer module 510 data using the channel estimation data to generate equalized data.

At block 730, demodulating, by the receiver, the equalized signal to generate an output signal.

The described operations may be implemented as a method, system or article of manufacture using standard programming and/or engineering techniques to produce software, firmware, hardware, or any combination thereof. The described operations may be implemented as code maintained in a "non-transitory computer readable medium", where a processor may read and execute the code from the computer readable medium. The processor is at least one of a microprocessor and a processor capable of processing and executing the queries. A non-transitory computer readable medium may comprise media such as magnetic storage medium (e.g., hard disk drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), etc. Further, non-transitory computer-readable media comprise all computer-readable media except for a transitory. The code implementing the described operations may further be implemented in hardware logic (e.g., an integrated circuit chip, Programmable Gate Array (PGA), Application Specific Integrated Circuit (ASIC), etc.).

Still further, the code implementing the described operations may be implemented in "transmission signals", where transmission signals may propagate through space or through a transmission media, such as an optical fiber, copper wire, etc. The transmission signals in which the code or logic is encoded may further comprise a wireless signal, satellite transmission, radio waves, infrared signals, Bluetooth, etc. The transmission signals in which the code or logic is encoded is capable of being transmitted by a transmitting station and received by a receiving station, where the code or logic encoded in the transmission signal may be decoded and stored in hardware or a non-transitory computer readable medium at the receiving and transmitting stations or devices. An "article of manufacture" comprises non-transitory computer readable medium, hardware logic, and/or transmission signals in which code may be implemented. A device in which the code implementing the described embodiments of operations is encoded may comprise a computer readable medium or hardware logic. Of course, those skilled in the art will recognize that many modifications may be made to this configuration without departing from the scope of the invention, and that the article of manufacture may comprise suitable information bearing medium known in the art.

A description of an embodiment with several components in communication with each other does not imply that all such components are required. On the contrary a variety of optional components are described to illustrate the wide variety of possible embodiments of the invention.

When a single device or article is described herein, it will be clear that more than one device/article (whether they cooperate) may be used in place of a single device/article. Similarly, where more than one device or article is described herein (whether they cooperate), it will be clear that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments of the invention need not include the device itself.

Finally, the language used in the specification has been principally selected for readability and instructional purposes, and it may not have been selected to delineate or circumscribe the inventive subject matter. It is therefore intended that the scope of the invention be limited not by this detailed description. Accordingly, the disclosure of the embodiments of the invention is intended to be illustrative, but not limiting, of the scope of the invention.

While various aspects and embodiments have been disclosed herein, other aspects and embodiments will be apparent to those skilled in the art. The various aspects and embodiments disclosed herein are for purposes of illustration and are not intended to be limiting.

I claim:

1. A method of transmitting a signal stream from a plurality of antennas, the method comprising:
   grouping, by a transmitter, a plurality of consecutive signals of the input to obtain a plurality of groups;
   generating, by the transmitter, a plurality of physical resource groups (PRGs) using the plurality of groups and a corresponding plurality of subcarriers;
   precoding, by the transmitter, the plurality of PRGs using one or more weighing coefficients to obtain a precoded plurality of groups;
   processing, by the transmitter, the precoded plurality of groups to obtain a processed plurality of groups; and
   transmitting, by the transmitter, the plurality of processed signal groups using a corresponding plurality of antennas to one or more receivers;
   wherein an indication about variation of the weighing coefficients corresponding to each of plurality of PRGs is provided by the transmitter to the one or more receivers.

2. The method as claimed in claim 1, wherein the input is at least one of data symbols, control information and pilot symbols.

3. The method as claimed in claim 1, wherein the input is at least one of an Orthogonal Frequency Division Multiple Access (OFDMA) signal and a Discrete Fourier Transform spread OFDM (DFT-S-OFDMA) signal.

4. The method as claimed in claim 1, wherein each of the plurality of PRGs is precoded with same weighing coefficient to obtain the precoded plurality of groups.

5. The method as claimed in claim 1, wherein each of the plurality of PRGs is precoded with different weighing coefficient to obtain the precoded plurality of groups.

6. The method as claimed in claim 1, wherein precoding the plurality of PRGs comprises one of a M number of PRGs are precoded by a weighing coefficient W1 and each of a remaining N number of PRGs are precoded by a corresponding weighing coefficient to obtain the precoded plurality of groups, wherein M and N is an integer; and a M number of PRGs are precoded by a weighing coefficient W1 and each of a remaining N number of PRGs are precoded by a weighing coefficient W2 to obtain the precoded plurality of groups.

7. The method as claimed in claim 1, wherein processing the plurality of precoded transformed groups comprising:
   performing an Inverse Fast Fourier Transform (IFFT) operation on the precoded plurality of groups to produce a time domain signal groups; and
   performing, by the transmitter, at least one of cyclic prefix (CP), windowing, and frequency shifting on the time domain signal groups, to generate a plurality of processed signal groups.

8. The method as claimed in claim 1, wherein the precoded signal stream is transformed using Discrete Fourier Transform (DFT) operation to obtain transformed data for the input DFT-s-OFDM, thereafter precoding is performed.

9. The method as claimed in claim 1, wherein the indication about variation of the weighing coefficients is performed by the transmitter using at least one of downlink control information (DCI) and Uplink Control Information (UCI) associated with the transmitter.

10. A transmitter, comprising:
    a plurality of antennas for transmitting a signal stream;
    a processor; and
    a memory communicatively coupled with the processor, wherein the processor is configured to:
    group a plurality of consecutive signals of the input to obtain a plurality of groups;
    generate a plurality of physical resource units (PRGs) using the plurality of groups and a corresponding plurality of subcarriers;
    pre-code the plurality of PRGs using one or more weighing coefficients to obtain a precoded plurality of groups;
    process the precoded plurality of groups to obtain a processed plurality of groups; and
    transmit the plurality of processed signal groups using the corresponding plurality of antennas;
    wherein an indication about variation of the weighing coefficients corresponding to each of plurality of PRGs is provided by the transmitter to the one or more receivers.

11. The transmitter as claimed in claim 10, wherein the input is at least one of data symbols, control information and pilot symbols.

12. The transmitter as claimed in claim 10, wherein the input is at least one of an Orthogonal Frequency Division Multiple Access (OFDMA) signal and a DFT-S-OFDMA signal.

13. The transmitter as claimed in claim 10, wherein each of the plurality of PRGs are precoded with same weighing coefficient to obtain the precoded plurality of groups.

14. The transmitter as claimed in claim 10, wherein each of the plurality of PRGs is precoded by different weighing coefficient to obtain the precoded plurality of groups.

15. The transmitter as claimed in claim 10, wherein precoding the plurality of PRGs comprises one of a M number of PRGs are precoded by a weighing coefficient W1 and each of a remaining N number of PRGs are precoded by a corresponding weighing coefficient to obtain the precoded plurality of groups, wherein M and N is an integer; and a M number of PRGs are precoded by a weighing coefficient W1 and each of a remaining N number of PRGs are precoded by a weighing coefficient W2 to obtain the precoded plurality of groups.

16. The transmitter as claimed in claim 10, wherein the processor processes the plurality of precoded groups comprising steps of:
    performing an Inverse Fast Fourier Transform (IFFT) operation on the precoded plurality of groups to produce a time domain signal groups; and
    performing, by the transmitter, at least one of cyclic prefix (CP), windowing, and frequency shifting on the time domain signal groups, to generate a plurality of processed signal groups.

17. The transmitter as claimed in claim 10, wherein the precoded signal stream is transformed using Discrete Fourier Transform (DFT) operation to obtain transformed data for the input DFT-s-OFDM.

18. The transmitter as claimed in claim 10, wherein the indication about variation of the weighing coefficients is performed by the transmitter using at least one of downlink control information (DCI) and Uplink Control Information (UCI) associated with the transmitter.

* * * * *